US011489070B2

(12) United States Patent
Kikuchi et al.

(10) Patent No.: US 11,489,070 B2
(45) Date of Patent: Nov. 1, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takuo Kikuchi, Kamakura (JP); Yusuke Kawaguchi, Kanazawa (JP); Tatsuya Nishiwaki, Nonoichi (JP); Hidehiko Yabuhara, Kamakura (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 50 days.

(21) Appl. No.: 17/195,002

(22) Filed: Mar. 8, 2021

(65) Prior Publication Data
US 2021/0288178 A1    Sep. 16, 2021

(30) Foreign Application Priority Data

Mar. 12, 2020   (JP) .............................. JP2020-042970

(51) Int. Cl.
*H01L 29/78*    (2006.01)
*H01L 29/423*   (2006.01)

(52) U.S. Cl.
CPC ...... *H01L 29/7813* (2013.01); *H01L 29/4236* (2013.01); *H01L 29/42364* (2013.01)

(58) Field of Classification Search
CPC ............. H01L 29/7813; H01L 29/4236; H01L 29/42364

(Continued)

(56) References Cited

U.S. PATENT DOCUMENTS

| 7,416,948 B2 | 8/2008 | Kraft et al. |
| 2013/0062688 A1* | 3/2013 | Kobayashi .......... H01L 29/0878 257/330 |

(Continued)

FOREIGN PATENT DOCUMENTS

| JP | 2007-529115 | 10/2007 |
| JP | 2011-199109 A | 10/2011 |
| JP | 2015-225976 A | 12/2015 |

*Primary Examiner* — Igwe U Anya
(74) *Attorney, Agent, or Firm* — Oblon, McClelland, Maier & Neustadt, L.L.P.

(57) ABSTRACT

According to one embodiment, a semiconductor device includes first and second electrodes, first to third semiconductor regions, a structure body, and a gate electrode. The first semiconductor region is provided on the first electrode. The second semiconductor region is provided on the first semiconductor region. The third semiconductor region is provided selectively on the second semiconductor region. The structure body includes an insulating part and a conductive part. The insulating part is arranged with the third and second semiconductor regions, and a portion of the first semiconductor region. The conductive part is provided in the insulating part. The conductive part includes a portion facing the first semiconductor region. The gate electrode faces the second semiconductor region. The second electrode is provided on the second and third semiconductor regions, and the structure body. The second electrode is electrically connected to the second and third semiconductor regions, and the conductive part.

7 Claims, 15 Drawing Sheets

(58) Field of Classification Search
USPC .......................................................... 257/330
See application file for complete search history.

(56) References Cited

U.S. PATENT DOCUMENTS

2013/0134505 A1* 5/2013 Kobayashi .......... H01L 29/7813
438/270
2015/0349113 A1 12/2015 Katoh et al.
2017/0365708 A1* 12/2017 Li ........................ H01L 29/407
2021/0273091 A1* 9/2021 Lee .................. H01L 29/66734
2021/0384346 A1* 12/2021 Hsieh .................. H01L 29/0634

* cited by examiner

| V1 [V] | 80 | | 100 | | 150 | |
|---|---|---|---|---|---|---|
| STRUCTURE | STRIPE | DOT | STRIPE | DOT | STRIPE | DOT |
| HALF PITCH [μm] | 1.0 | 1.0 | 1.25 | 1.25 | 2.0 | 2.0 |
| CARRIER DENSITY [cm-3] | $5.0 \times 10^{16}$ | $3.8 \times 10^{16}$ | $4.0 \times 10^{16}$ | $3.0 \times 10^{16}$ | $2.2 \times 10^{16}$ | $1.6 \times 10^{16}$ |
| Tsi [μm] | 0.4 | 0.4 | 0.5 | 0.5 | 0.9 | 0.9 |
| Tox [μm] | 0.5 | 0.34 | 0.65 | 0.45 | 1.0 | 0.66 |
| Tox / V1 | 0.00625 | 0.00425 | 0.0065 | 0.0045 | 0.006 | 0.0048 |

FIG. 10

SEMICONDUCTOR DEVICE

CROSS-REFERENCE TO RELATED APPLICATIONS

This application is based upon and claims the benefit of priority from Japanese Patent Application No.2020-042970, filed on Mar. 12, 2020; the entire contents of which are incorporated herein by reference.

FIELD

Embodiments described herein relate generally to a semiconductor device.

BACKGROUND

A semiconductor device such as a metal oxide semiconductor field effect transistor (MOSFET) or the like is used in applications such as power conversion, etc. It is desirable to increase the breakdown voltage of the semiconductor device.

BRIEF DESCRIPTION OF THE DRAWINGS

FIG. 10 is a table illustrating the design values of the semiconductor device according to the first embodiment and the semiconductor device according to the reference example;

DETAILED DESCRIPTION

Figure 1:
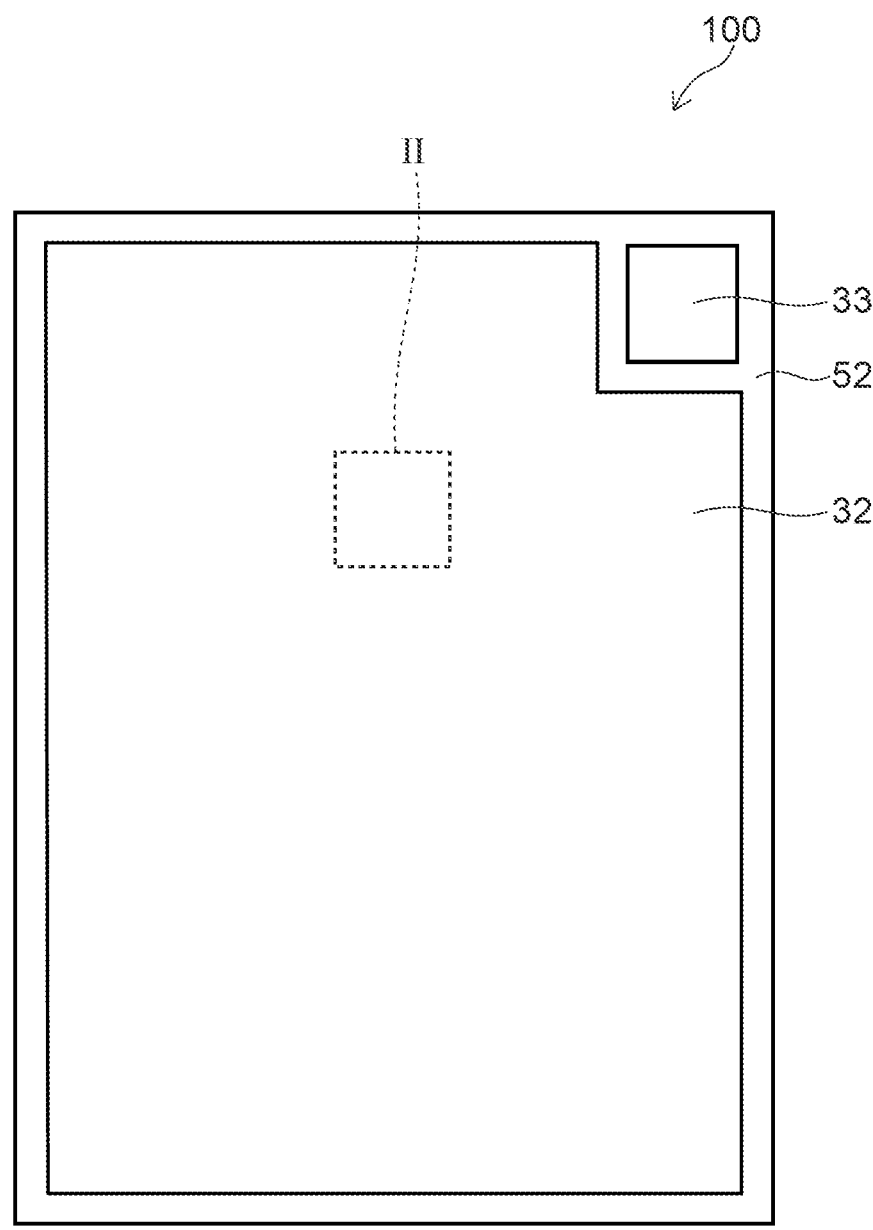
FIG. 1 is a plan view illustrating a semiconductor device according to a first embodiment.
Figure 1:
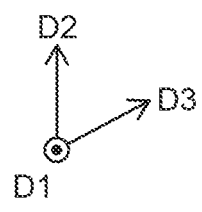

According to one embodiment, a semiconductor device includes a first electrode, a first semiconductor region of a first conductivity type, a second semiconductor region of a second conductivity type, a third semiconductor region of the first conductivity type, a structure body, a gate electrode, and a second electrode. The first semiconductor region is provided on the first electrode. The second semiconductor region is provided on the first semiconductor region. The third semiconductor region is provided selectively on the second semiconductor region. The structure body includes an insulating part and a conductive part. The insulating part is arranged with the third semiconductor region, the second semiconductor region, and a portion of the first semiconductor region in a second direction and a third direction. The second direction is perpendicular to a first direction from the first electrode toward the first semiconductor region. The third direction crosses the second direction and is perpendicular to the first direction. The conductive part is provided in the insulating part. The conductive part includes a portion facing the first semiconductor region in the second and third directions. The gate electrode faces the second semiconductor region in the second and third directions. The second electrode is provided on the second semiconductor region, the third semiconductor region, and the structure body. The second electrode is electrically connected to the second semiconductor region, the third semiconductor region, and the conductive part. A plurality of structure bodies are arranged along the second and third directions. A ratio (μm/V) to a product breakdown voltage (V) of a thickness (μm) of the insulating part in a direction perpendicular to the first direction is not more than 0.0055.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

First Embodiment

FIG. 1 is a plan view illustrating a semiconductor device according to a first embodiment.

Figure 2:
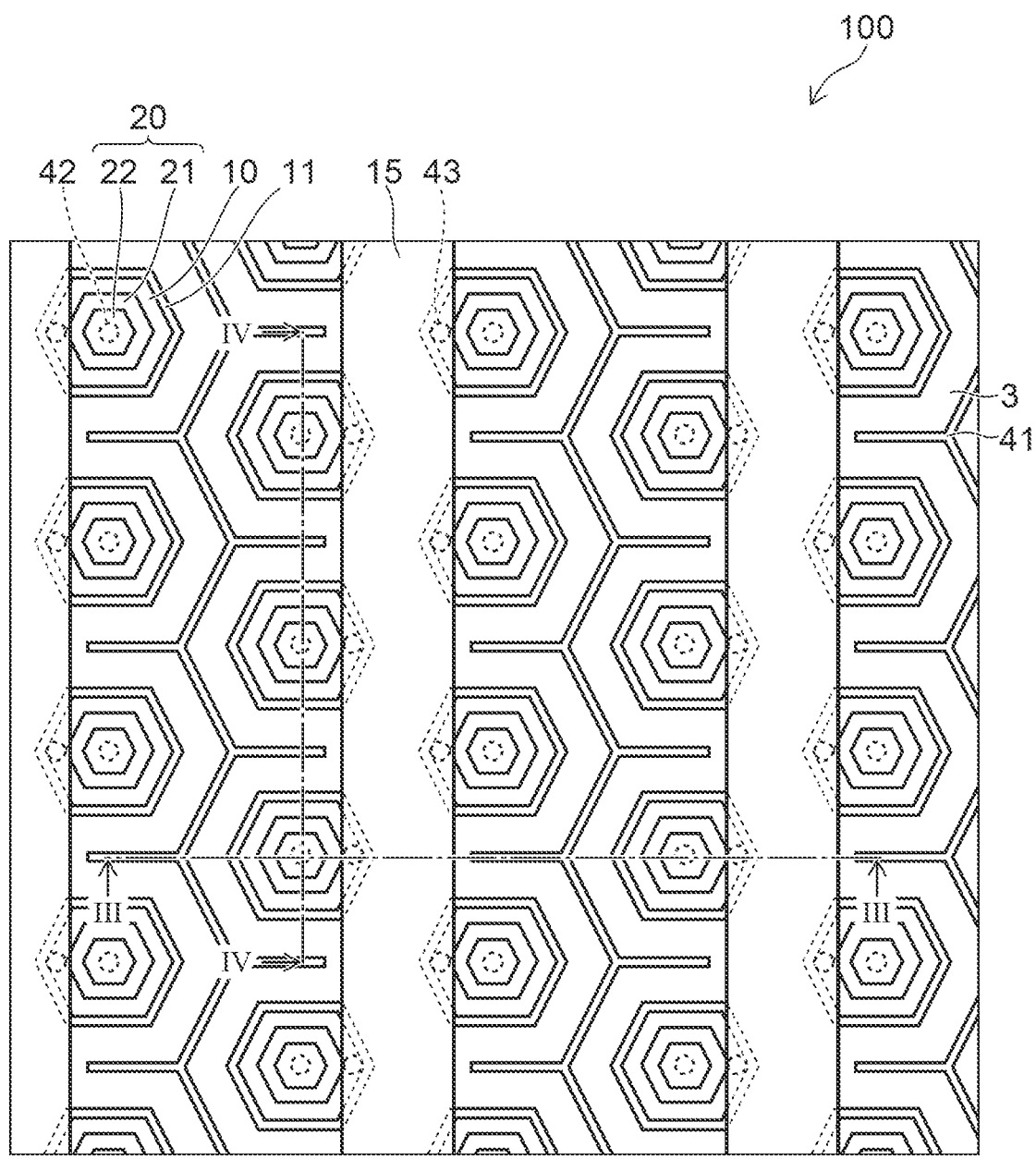
FIG. 2 is a plan view illustrating portion II of FIG. 1.
Figure 2:
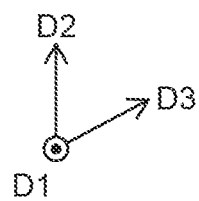

FIG. 2 is a plan view illustrating portion II of FIG. 1. A source electrode 32, an insulating layer 51, an insulating layer 52, etc., are not illustrated in FIG. 2.

Figure 3:
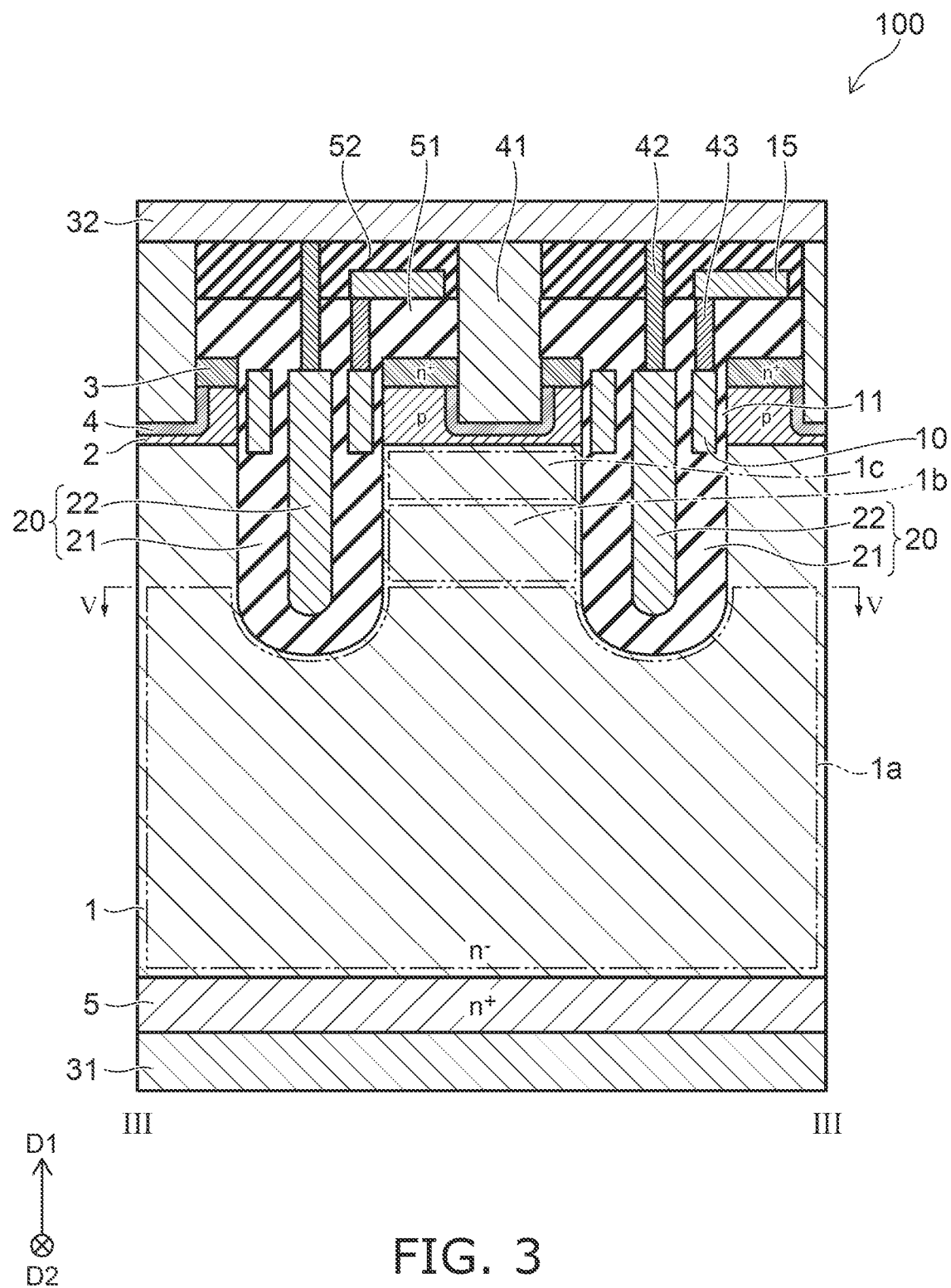
FIG. 3 is a III-III cross-sectional view of FIG. 2.
Figure 4:
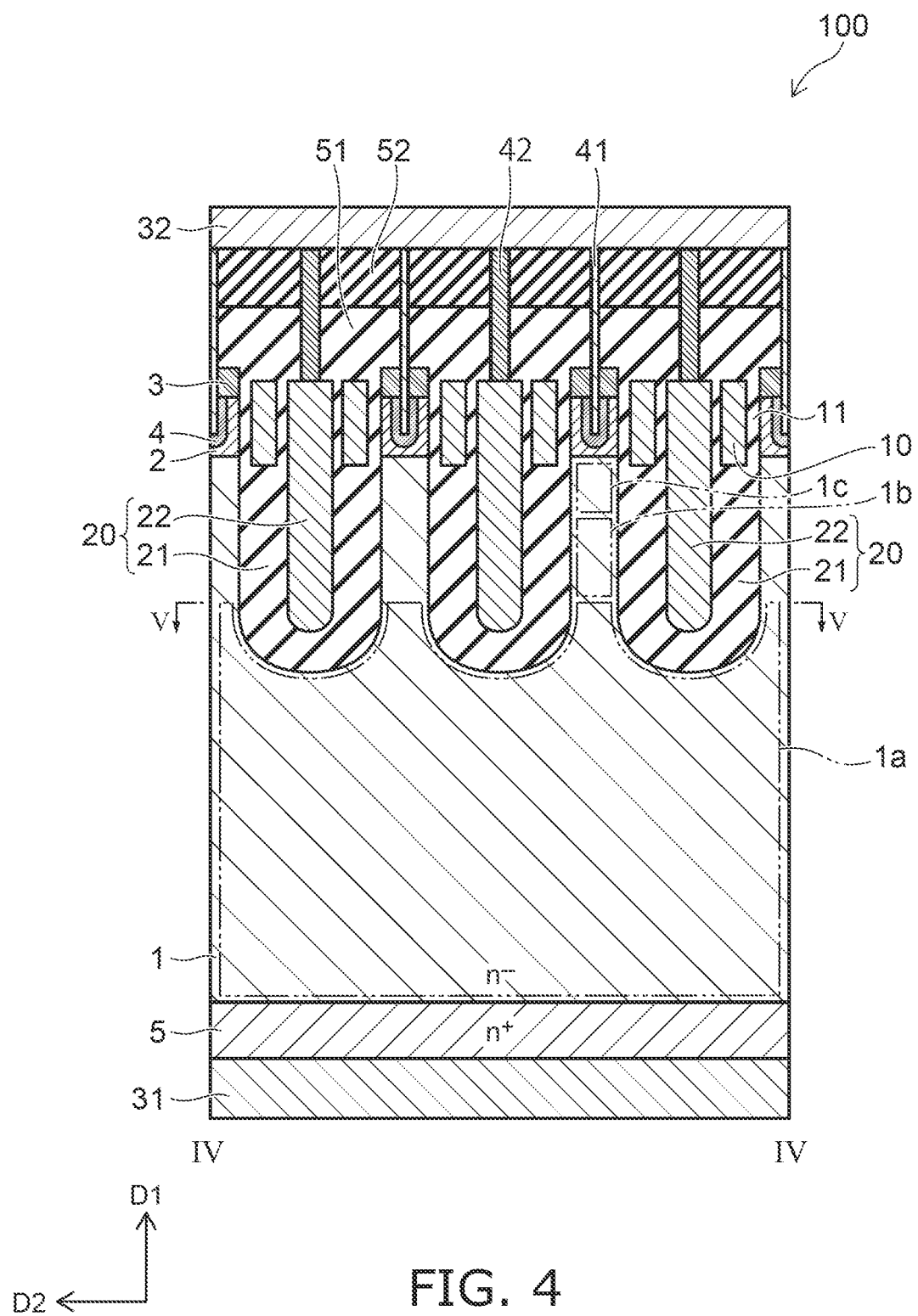
FIG. 4 is a IV-IV cross-sectional view of FIG. 2.

FIG. 3 is a III-III cross-sectional view of FIG. 2. FIG. 4 is a Iv-Iv cross-sectional view of FIG. 2.

The semiconductor device 100 according to the first embodiment is, for example, a MOSFET. As illustrated in FIGS. 1 to 4, the semiconductor device 100 according to the first embodiment includes an $n^-$-type (first-conductivity-type) drift region 1 (a first semiconductor region), a p-type (second-conductivity-type) base region 2 (a second semiconductor region), an n+-type source region 3 (a third semiconductor region), a p+-type contact region 4, an n+-type drain region 5, a gate electrode 10, a gate interconnect 15, a structure body 20, a drain electrode 31 (a first electrode), the source electrode 32 (a second electrode), a gate pad 33, connection parts 41 to 43, the insulating layer 51, and the insulating layer 52.

A first direction D1, a second direction D2, and a third direction D3 are used in the description of the following embodiments. The direction from the drain electrode 31 toward the n−-type drift region 1 is taken as the first direction D1. One direction perpendicular to the first direction D1 is taken as the second direction D2. A direction that crosses the second direction D2 and is perpendicular to the first direction D1 is taken as the third direction D3. In the description, the direction from the drain electrode 31 toward the n−-type drift region 1 is called "up", and the reverse direction is called "down". These directions are based on the relative positional relationship between the drain electrode 31 and the n−-type drift region 1 and are independent of the direction of gravity.

As illustrated in FIG. 1, the source electrode 32 and the gate pad 33 are located at the upper surface of the semiconductor device 100. The source electrode 32 and the gate pad 33 are electrically isolated from each other.

As illustrated in FIGS. 3 and 4, the drain electrode 31 is located at the lower surface of the semiconductor device 100. The n−-type drift region 1 is located on the drain electrode 31 with the n+-type drain region 5 interposed. The n−-type drift region 1 is electrically connected to the drain electrode 31 via the n+-type drain region 5. The p-type base region 2 is located on the n−-type drift region 1. The n+-type source region 3 and the p+-type contact region 4 are selectively provided on the p-type base region 2.

The structure body 20 includes an insulating part 21 and a conductive part 22. The insulating part 21 is arranged with the n+-type source region 3, the p-type base region 2, and a portion of the n−-type drift region 1 in the second and third directions D2 and D3. The conductive part 22 is located in the insulating part 21. At least a portion of the conductive part 22 is arranged with a portion of the n−-type drift region 1 in the second and third directions D2 and D3.

In the semiconductor device 100, the gate electrode 10 also is located in the insulating part 21. The gate electrode 10 is located around the conductive part 22 upper portion along the X-Y plane. A portion of the insulating part 21 is located between the gate electrode 10 and the conductive part 22. Thereby, the gate electrode 10 and the conductive part 22 are electrically isolated from each other.

The gate electrode 10 faces the p-type base region 2 via a gate insulating layer 11 in the second and third directions D2 and D3. The gate electrode 10 also may face the n−-type drift region 1 and the n+-type source region 3 via the gate insulating layer 11. In the semiconductor device 100, a portion of the insulating part 21 functions as the gate insulating layer 11.

As illustrated in FIG. 2, multiple gate electrodes 10 and multiple structure bodies 20 are arranged along the second and third directions D2 and D3. For example, one continuous p-type base region 2 is provided around the multiple gate electrodes 10. The multiple n+-type source regions 3 are provided respectively around the multiple gate electrodes 10.

As illustrated in FIGS. 3 and 4, the n−-type drift region 1 may include a first region 1a, a second region 1b, and a third region 1c. The first region 1a is positioned between the drain electrode 31 and the multiple structure bodies 20 and between the lower ends of the conductive parts 22. Each second region 1b is positioned between adjacent structure bodies 20. The third region 1c is positioned between the second region 1b and the p-type base region 2 in the first direction D1. The n-type impurity concentration in the second region 1b is less than the n-type impurity concentration in the first region 1a. The n-type impurity concentration in the third region 1c is less than the n-type impurity concentration in the second region 1b. For example, the length in the first direction D1 of the second region 1b is greater than the length in the first direction D1 of the third region 1c.

The insulating layer 51 is located on the p-type base region 2, the multiple n+-type source regions 3, the multiple gate electrodes 10, and the multiple structure bodies 20. The gate interconnect 15 is located on the insulating layer 51. The insulating layer 52 is located on the gate interconnect 15 and the insulating layer 51. The source electrode 32 and the gate pad 33 are located on the insulating layer 52.

The source electrode 32 is positioned on the p-type base region 2, the multiple n+-type source regions 3, the multiple gate electrodes 10, and the multiple structure bodies 20. The p-type base region 2 and the n+-type source region 3 are electrically connected to the source electrode 32 via the connection part 41. For example, the source electrode 32 is electrically connected to the multiple n+-type source regions 3 arranged along the second direction D2 via one connection part 41. Also, the source electrode 32 is electrically connected to the conductive part 22 via the connection part 42. For example, the source electrode 32 is electrically connected to the multiple conductive parts 22 respectively via the multiple connection parts 42.

The p+-type contact region 4 is located between the p-type base region 2 and the connection part 41. The p-type base region 2 is electrically connected to the source electrode 32 via the p+-type contact region 4 and the connection part 41. In the semiconductor device 100, the lower portion of the connection part 41 is located between the n+-type source regions 3; and the p+-type contact region 4 is positioned lower than the n+-type source region 3.

The gate electrode 10 is electrically isolated from the source electrode 32. The gate electrode 10 is electrically connected to the gate interconnect 15 via the connection part 43. The gate interconnect 15 is electrically connected to the gate pad 33. As illustrated in FIG. 2, multiple gate interconnects 15 are arranged in the third direction D3. One gate interconnect 15 is electrically connected to the multiple gate electrodes 10 arranged in the second direction D2 respectively via the multiple connection parts 43.

Operations of the semiconductor device 100 will now be described.

A voltage that is not less than a threshold is applied to the gate electrode 10 in a state in which a positive voltage with respect to the source electrode 32 is applied to the drain electrode 31. A channel (an inversion layer) is formed in the p-type base region 2 thereby, and the semiconductor device 100 is set to the on-state. Electrons pass through the channel and flow from the source electrode 32 toward the drain electrode 31. Subsequently, when the voltage applied to the gate electrode 10 becomes less than the threshold, the channel in the p-type base region 2 disappears, and the semiconductor device 100 is set to the off-state.

When the semiconductor device 100 switches to the off-state, the positive voltage with respect to the source electrode 32 that is applied to the drain electrode 31 increases. In other words, the potential difference between the n−-type drift region 1 and the conductive part 22 increases. Due to the increase of the potential difference, a depletion layer spreads toward the n⁻-type drift region 1 from the interface between the insulating part 21 and the n⁻-type drift region 1. In other words, the conductive part 22 functions as a field plate electrode. The breakdown voltage of the semiconductor device 100 can be increased by the spreading of the depletion layer. Or, the on-resistance of the semiconductor device 100 can be reduced by increasing the n-type impurity concentration in the n⁻-type drift region 1 while maintaining the breakdown voltage of the semiconductor device 100.

Examples of the materials of the components of the semiconductor device 100 will now be described.

The n⁻-type drift region 1, the p-type base region 2, the n⁺-type source region 3, the p⁺-type contact region 4, and the n⁺-type drain region 5 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The gate electrode 10 and the conductive part 22 include a conductive material such as polysilicon, etc. An impurity may be added to the conductive material. The insulating part 21, the insulating layer 51, and the insulating layer 52 include an insulating material. For example, the insulating part 21, the insulating layer 51, and the insulating layer 52 include silicon oxide or silicon nitride. The drain electrode 31, the source electrode 32, and the gate pad 33 include a metal such as aluminum, copper, etc. The connection parts 41 to 43 include a metal such as tungsten, aluminum, copper, etc.

According to the first embodiment, the ratio (μm/V) to the product breakdown voltage (V) of the semiconductor device 100 of the thickness (μm) of at least one insulating part 21 in a direction perpendicular to the first direction D1 is not more than 0.0055. The product breakdown voltage is the minimum required breakdown voltage of the semiconductor device 100, and is the voltage assumed to be applied to the semiconductor device 100 in actual use. Typically, the product breakdown voltage is recited in the catalog, the technical specification, etc., of the semiconductor device. By setting the ratio (μm/V) to be not more than 0.0055, the actual breakdown voltage of the semiconductor device 100 can be increased. The actual breakdown voltage is the actual breakdown voltage of the semiconductor device 100 and is greater than the product breakdown voltage. Generally, the actual breakdown voltage of the semiconductor device is designed to be a value that is greater than about 1.0 times and less than about 1.2 times the product breakdown voltage.

The actual breakdown voltage of the semiconductor device is determined based on the current-voltage characteristic.

Specifically, the current between the drain electrode 31 and the source electrode 32 is measured while gradually increasing the positive voltage of the drain electrode 31 with respect to the source electrode 32 in a state in which a voltage is not applied to the gate electrode 10. When the positive voltage exceeds the actual breakdown voltage, breakdown occurs in the n⁻-type drift region 1; and the current steeply increases. The voltage at which the breakdown occurs is the actual breakdown voltage of the semiconductor device.

To further improve the actual breakdown voltage, it is favorable for the ratio (μm/V) to the product breakdown voltage (V) of the semiconductor device 100 of the thickness (μm) of each insulating part 21 in the perpendicular direction to be not more than 0.0055. Favorable configurations are described below in detail.

Figure 5:
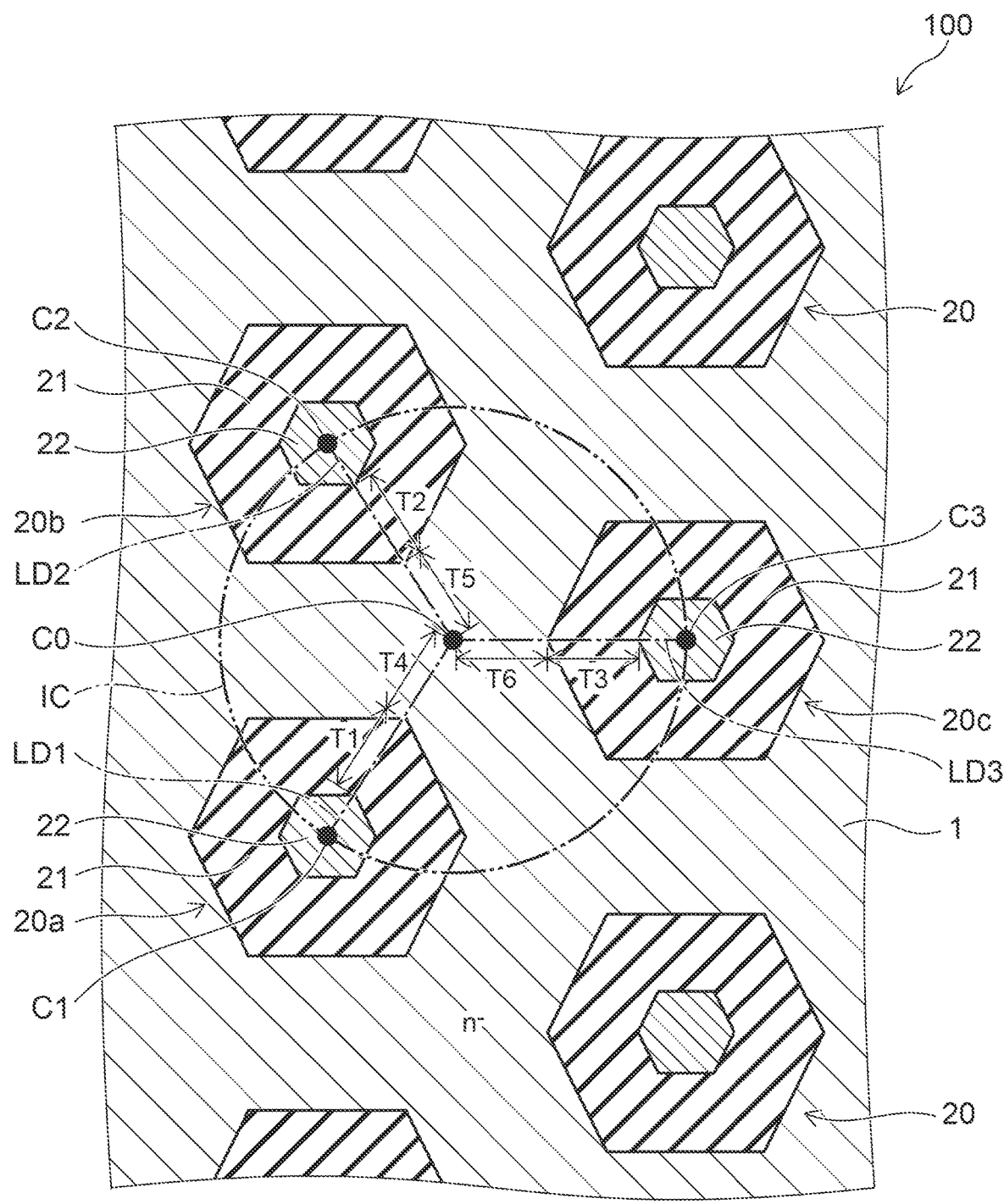
FIG. 5 is a V-V cross-sectional view of FIGS. 3 and 4.

FIG. 5 is a V-V cross-sectional view of FIGS. 3 and 4.

As illustrated in FIG. 5, the multiple structure bodies 20 that are arranged along the second and third directions D2 and D3 include a first structure body 20a, a second structure body 20b, and a third structure body 20c. The first structure body 20a is one of the multiple structure bodies 20. The second structure body 20b is next to the first structure body 20a in the second direction D2. The third structure body 20c is next to the first structure body 20a in the third direction D3.

In FIG. 5, a first center C1 is the center of the first structure body 20a in the second and third directions D2 and D3. A second center C2 is the center of the second structure body 20b in the second and third directions D2 and D3. A third center C3 is the center of the third structure body 20c in the second and third directions D2 and D3. Here, an imaginary circle IC that passes through the first center C1, the second center C2, and the third center C3 is considered. In the semiconductor device 100, the first center C1, the second center C2, and the third center C3 exist on the circumference of one imaginary circle IC. The distance between the first center C1 and a circle center C0 of the imaginary circle IC is equal to the distance between the circle center C0 and the second center C2 and equal to the distance between the circle center C0 and the third center C3.

The thickness of the insulating part 21 in a first line direction LD1 between the circle center C0 and the first center C1 is taken as T1. The first line direction LD1 is a direction that connects the circle center C0 and the first center C1. The ratio (μm/V) of the thickness T1 (μm) to a product breakdown voltage V1 (V) of the semiconductor device 100 is not more than 0.0055. For example, the angle between the first line direction LD1 and the second direction D2 is equal to the angle between the first line direction LD1 and the third direction D3. In the illustrated example, the angle between the second direction D2 and the third direction D3 is 60 degrees; and the angle between the first line direction LD1 and the second direction D2 is 30 degrees.

Similarly, the thickness of the insulating part 21 in a second line direction LD2 between the circle center C0 and the second center C2 is taken as T2. The second line direction LD2 is a direction that connects the circle center C0 and the second center C2. The ratio (μm/V) of the thickness T2 (μm) to the product breakdown voltage V1 (V) is not more than 0.0055. The thickness of the insulating part 21 in a third line direction LD3 between the circle center C0 and the third center C3 is taken as T3. The third line direction LD3 is a direction that connects the circle center C0 and the third center C3. The ratio (μm/V) of the thickness T3 (μm) to the product breakdown voltage V1 (V) is not more than 0.0055.

Effects according to the first embodiment will now be described.

Figure 6:
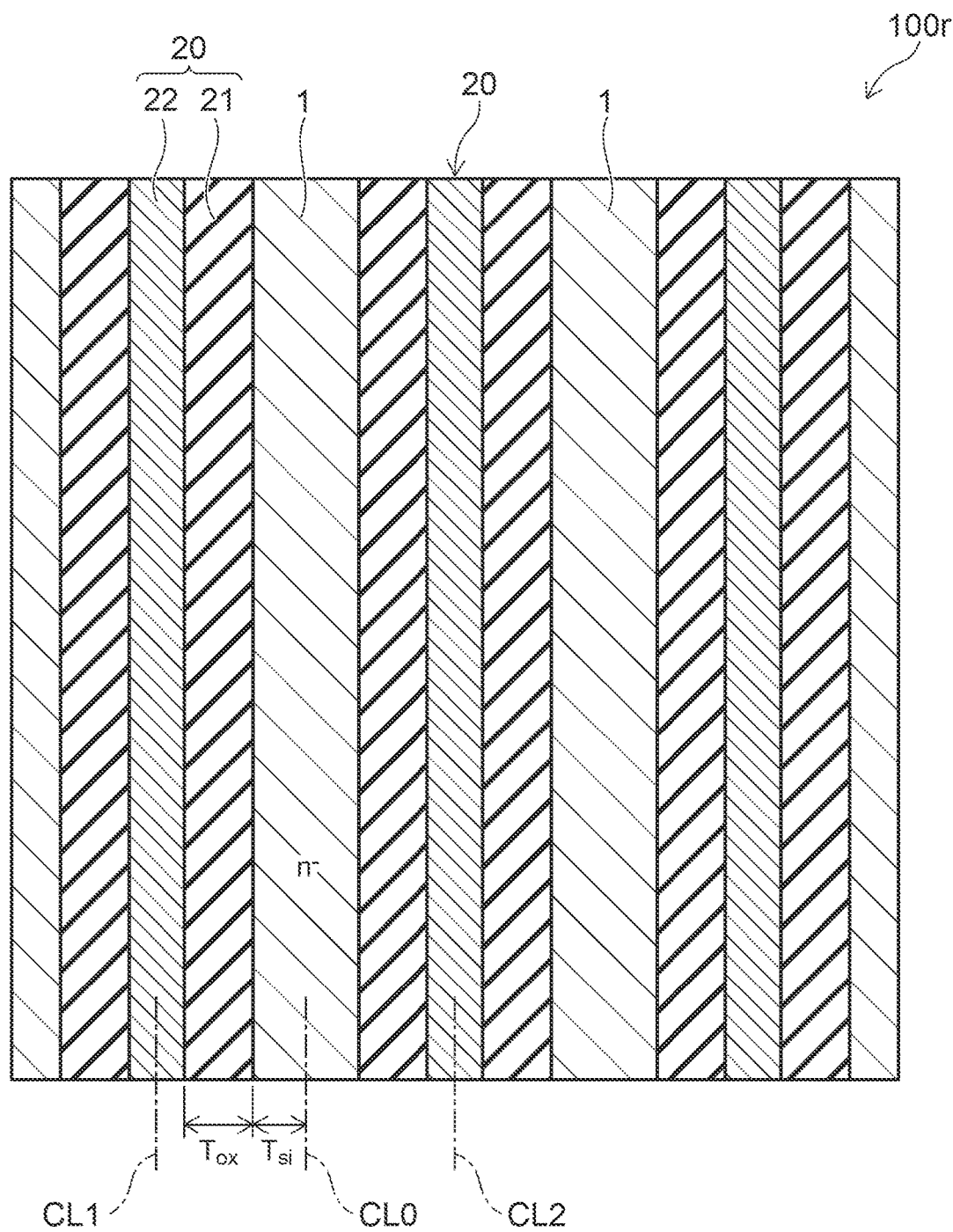
FIG. 6 is a plan view illustrating a semiconductor device according to a reference example.

FIG. 6 is a plan view illustrating a semiconductor device according to a reference example.

In the semiconductor device 100r according to the reference example illustrated in FIG. 6, the structure body 20 that includes the insulating part 21 and the conductive part 22 extends in the second direction D2. The multiple structure bodies 20 are arranged in the third direction D3 that is perpendicular to the first and second directions D1 and D2. In other words, in the semiconductor device 100 illustrated in FIGS. 1 to 5, the multiple structure bodies 20 have dot-type structures arranged along the second and third directions D2 and D3. Conversely, in the semiconductor device 100r illustrated in FIG. 6, the structure bodies 20 have stripe-type structures extending in the second direction D2.

According to the dot-type semiconductor device 100, compared to the stripe-type semiconductor device 100r, the volume of the n⁻-type drift region 1 that is used as the current path can be increased. Accordingly, according to the first embodiment, compared to the semiconductor device 100r, the on-resistance of the semiconductor device 100 can be reduced.

On the other hand, the inventors discovered the following problems for the semiconductor device 100 according to the first embodiment.

Figure 7A:
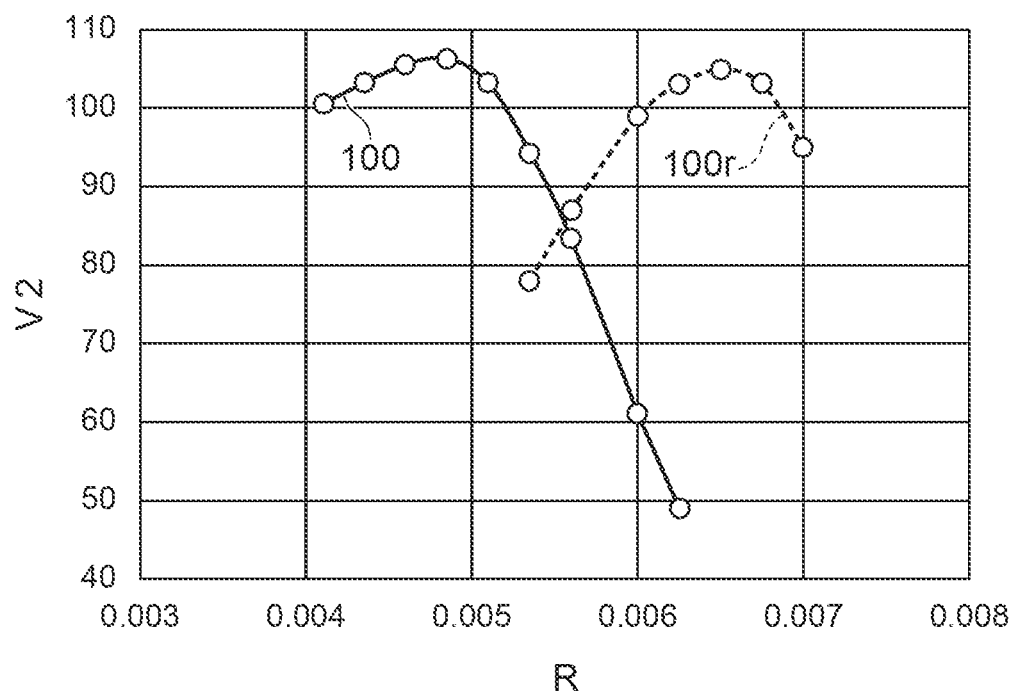
FIGS. 7A and 7B are graphs illustrating characteristics of the semiconductor device according to the first embodiment and the semiconductor device according to the reference example.
Figure 7B:
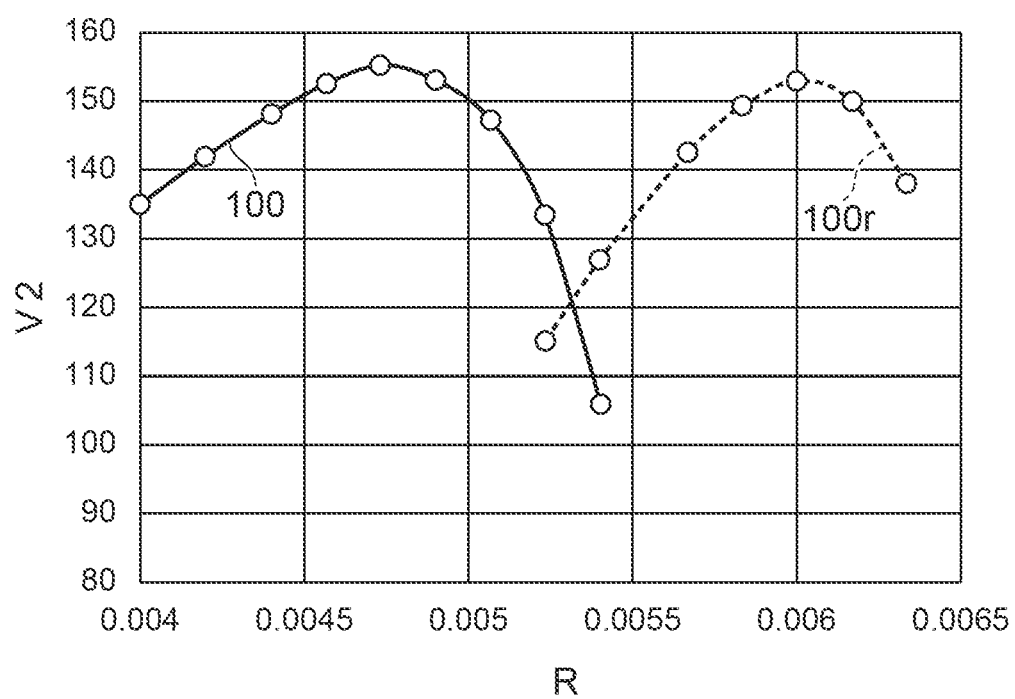

FIGS. 7A and 7B are graphs illustrating characteristics of the semiconductor device according to the first embodiment and the semiconductor device according to the reference example.

In FIGS. 7A and 7B, the solid lines illustrate the characteristics of the semiconductor device 100 according to the first embodiment. The broken lines illustrate the characteristics of the semiconductor device 100r according to the reference example. In FIGS. 7A and 7B, the horizontal axis is a ratio R (μm/V) of a thickness $T_{ox}$ (μm) of the insulating part 21 to the product breakdown voltage V1 (V). For example, the thickness $T_{ox}$ corresponds to the thicknesses T1 to T3 illustrated in FIG. 5. The vertical axis is an actual breakdown voltage V2 (V). FIG. 7A illustrates simulation results in which the product breakdown voltages of the semiconductor devices are 100 V. FIG. 7B illustrates simulation results in which the product breakdown voltages of the semiconductor devices are 150 V.

As illustrated in FIG. 6, in the semiconductor device 100r according to the reference example, center lines CL1 and CL2 pass through the third direction D3 centers of adjacent structure bodies 20. A center line CL0 passes through the center between the center lines CL1 and CL2. In the semiconductor device 100r, the thickness of the insulating part 21 between the center lines CL0 and CL1 corresponds to the thickness $T_{ox}$.

In the simulation of FIG. 7A, the conditions were set as follows. A thickness $T_{si}$ was 0.5 μm. The length in the first direction D1 of the insulating part 21 was 5.5 μm. The length in the first direction D1 of the conductive part 22 was 5.0 μm. The relative dielectric constant of the insulating part 21 was 3.9. For the semiconductor device 100, the carrier density in the n⁻-type drift region 1 (the first region 1a) was 3.0×10¹⁶ atoms/cm³. For the semiconductor device 100r, the carrier density in the n⁻-type drift region 1 (the first region 1a) was 4.0×10¹⁶ atoms/cm³.

In the simulation of FIG. 7B, the conditions were set as follows. The thickness $T_{si}$ was 0.9 μm. The length in the first direction D1 of the insulating part 21 was 9.5 μm. The length in the first direction D1 of the conductive part 22 was 9.0 μm. The relative dielectric constant of the insulating part 21 was 3.9. For the semiconductor device 100, the carrier density in the n⁻-type drift region 1 (the first region 1a) was 1.6×10¹⁶ atoms/cm³. For the semiconductor device 100r, the carrier density in the n⁻-type drift region 1 (the first region 1a) was 2.2×10¹⁶ atoms/cm³.

In the semiconductor device 100, the thickness $T_{si}$ corresponds to a thickness T4 of the n⁻-type drift region 1 in the first line direction LD1 between the circle center C0 and the first center C1 as illustrated in FIG. 5. Or, the thickness $T_{si}$ corresponds to a thickness T5 of the n⁻-type drift region 1 in the second line direction LD2 between the circle center C0 and the second center C2; or the thickness $T_{si}$ corresponds to a thickness T6 of the n⁻-type drift region 1 in the third line direction LD3 between the circle center C0 and the third center C3. In the semiconductor device 100r, the thickness $T_{si}$ corresponds to the thickness of the n⁻-type drift region 1 between the center lines CL0 and CL1.

When the n⁻-type drift region 1 includes silicon as the semiconductor material, the activation rate of the impurity is roughly 1. Accordingly, the n-type impurity concentration in the n⁻-type drift region 1 can be considered to be substantially equal to the carrier density in the n⁻-type drift region 1. FIGS. 7A and 7B illustrate the simulation results when the thickness $T_{si}$ and the carrier density in the n⁻-type drift region 1 are set to values suited to each product breakdown voltage. The thickness $T_{si}$ and the carrier density in the n⁻-type drift region 1 are set so that the electric field intensity at the interface between the insulating part 21 and the n⁻-type drift region 1 is the critical electric field intensity, and the entire n⁻-type drift region 1 between the structure bodies 20 is depleted. For example, when the n⁻-type drift region 1 includes silicon as the semiconductor material, the critical electric field intensity is 0.3 MV/cm. FIGS. 7A and 7B illustrate the change of the actual breakdown voltage when the pitch of the structure body 20 is fixed respectively to 2.5 μm and 4.0 μm and the thickness $T_{ox}$ is changed.

In the stripe-type semiconductor device 100r illustrated in FIG. 6, the thickness $T_{ox}$ with respect to the product breakdown voltage V1 is designed to be relatively thick to increase the actual breakdown voltage. For example, for the semiconductor device 100r as illustrated in FIGS. 7A and 7B, the highest breakdown voltage is obtained when the ratio R (μm/V) is between 0.006 and 0.0065.

The inventors discovered that the actual breakdown voltage was greatly reduced by applying the ratio R used in the stripe-type semiconductor device 100r to the dot-type semiconductor device 100. For example, it was found that when a ratio R (μm/V) of 0.00625 at which a high actual breakdown voltage was obtained in the semiconductor device 100r was used, the actual breakdown voltage was less than 50 V for the semiconductor device having the product breakdown voltage of 100 V.

The inventors examined structures for obtaining a higher actual breakdown voltage in a dot-type structure. As a result, it was discovered that the actual breakdown voltage can be increased by reducing the ratio R compared to the semiconductor device 100r. For example, as illustrated in FIGS. 7A and 7B, for the semiconductor device 100r, the actual breakdown voltage is greatly reduced by reducing the ratio R (μm/V) below 0.006. Conversely, for the semiconductor device 100, the actual breakdown voltage was increased by reducing the ratio R, even in the range in which the ratio R (μm/V) was not more than 0.006. In particular, the actual breakdown voltage of the semiconductor device 100 exceeded the actual breakdown voltage of the semiconductor device 100r when the ratio R (μm/V) became 0.0055 or less. When the ratio R became 0.005 or less, the actual breakdown voltage of the semiconductor device 100r was greatly reduced, but the actual breakdown voltage of the semiconductor device 100 was greatly improved.

The inventors investigated why different ratios R can increase the actual breakdown voltage between the stripe-type and the dot-type. As a result, the following knowledge was obtained.

Figure 8A:
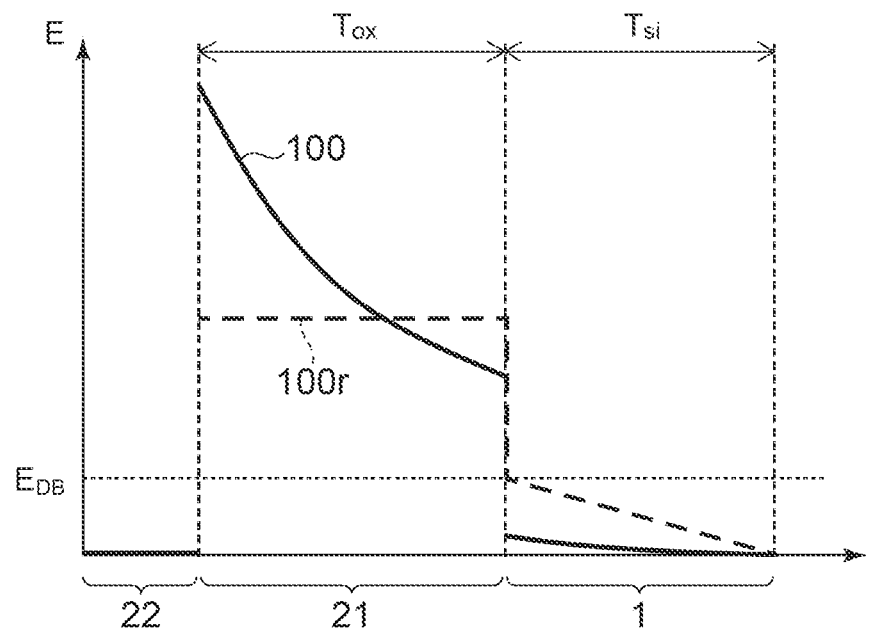
FIGS. 8A and 8B are graphs schematically illustrating characteristics of the semiconductor device according to the first embodiment and the semiconductor device according to the reference example.
Figure 8B:
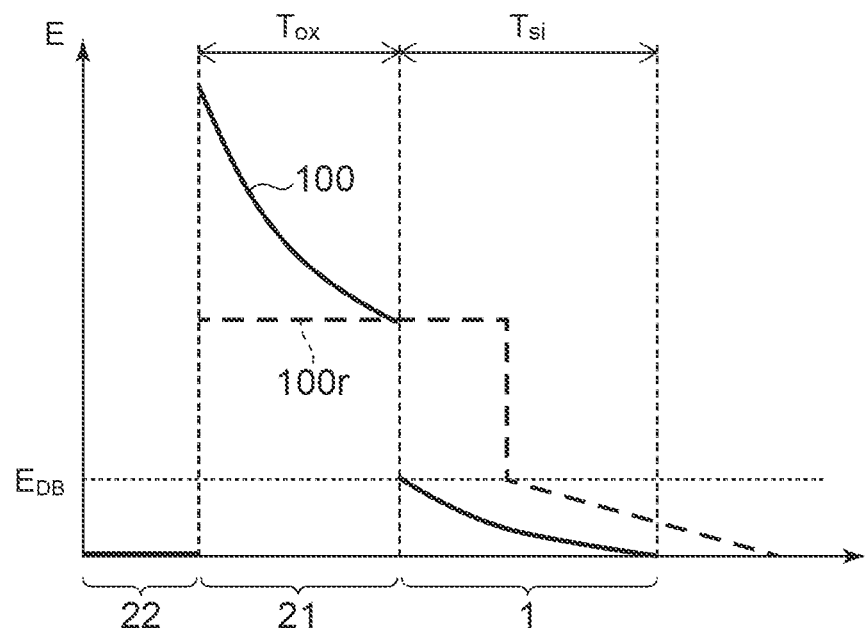

FIGS. 8A and 8B are graphs schematically illustrating characteristics of the semiconductor device according to the first embodiment and the semiconductor device according to the reference example.

In FIGS. 8A and 8B, the solid lines illustrate the characteristics of the semiconductor device 100 according to the first embodiment. The broken lines illustrate the characteristics of the semiconductor device 100r according to the reference example. The horizontal axis is the position in a lateral direction perpendicular to the first direction D1. The vertical axis is the electric field intensity at each position. For the semiconductor device 100, the horizontal axis is the position between the circle center C0 and the first center C1. For the semiconductor device 100r, the horizontal axis is the position between the center lines CL0 and CL1.

As illustrated by the broken line of FIG. 8A, in the stripe-type semiconductor device 100r, the thickness $T_{si}$ and the impurity concentration of the n⁻-type drift region 1 are designed so that an electric field intensity E at the insulating part 21 vicinity of the n⁻-type drift region 1 is a critical electric field intensity $E_{DB}$ of silicon. As a result, the ratio R (μm/V) of the thickness $T_{ox}$ (μm) to the product breakdown voltage V1 (V) is within the range of 0.006 to 0.0065.

The solid line of FIG. 8A illustrates the electric field intensity distribution when the same ratio R as the stripe-type semiconductor device 100r is applied to the dot-type semiconductor device 100. The electric field intensity in the insulating part 21 decreases away from the conductive part 22. As a result, in the semiconductor device 100, the electric field intensity at the boundary between the insulating part 21 and the n⁻-type drift region 1 is much less than the critical electric field intensity $E_{DB}$. As a result, the depletion layer in the n⁻-type drift region 1 does not sufficiently extend in the lateral direction; and the breakdown voltage is reduced.

The cause is considered to be as follows. In the semiconductor device 100r, the conductive part 22 faces the n⁻-type drift region 1 only in the third direction D3. Conversely, in the semiconductor device 100, the conductive part 22 faces the n⁻-type drift region 1 in the second and third directions D2 and D3. The surface area of the interface between the conductive part 22 and the insulating part 21 is less than the surface area of the interface between the insulating part 21 and the n⁻-type drift region 1. Therefore, the density of the lines of electric force extending from the interface between the insulating part 21 and the n⁻-type drift region 1 toward the conductive part 22 decreases away from the conductive part 22. It is considered that this decrease causes the electric field intensity in the insulating part 21 to decrease away from the conductive part 22.

FIG. 8B illustrates the characteristic of the semiconductor device 100 when the thickness $T_{ox}$ is designed so that the electric field intensity in the insulating part 21 vicinity of the n⁻-type drift region 1 is the critical electric field intensity $E_{DB}$. Comparing FIGS. 8A and 8B, it can be seen that compared to the stripe-type semiconductor device 100r, it is necessary to reduce the ratio R in the dot-type semiconductor device 100 to set the electric field intensity at the insulating part 21 vicinity of the n⁻-type drift region 1 to the critical electric field intensity $E_{DB}$. By reducing the ratio R, the breakdown voltage of the semiconductor device 100 can be increased while maintaining the n-type impurity concentration in the n⁻-type drift region 1.

Also, it is desirable for the ratio R (μm/V) to be not less than 0.003. When the ratio R (μm/V) is less than 0.003, the capacitance between the n⁻-type drift region 1 and the conductive part 22 becomes excessively large, and the electric field intensity between the n⁻-type drift region 1 and the conductive part 22 becomes too strong. Accordingly, it is desirable for the ratio R (μm/V) to be not less than 0.003 and not more than 0.0055.

Figure 9A:
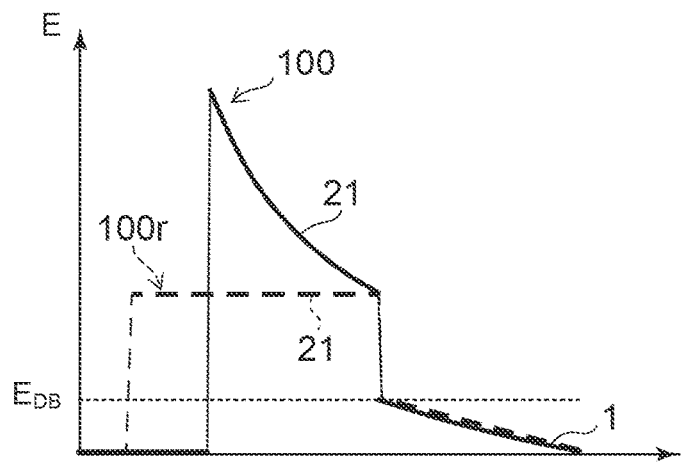
FIGS. 9A to 9C are graphs illustrating characteristics of the semiconductor device according to the first embodiment and the semiconductor device according to the reference example.
Figure 9B:
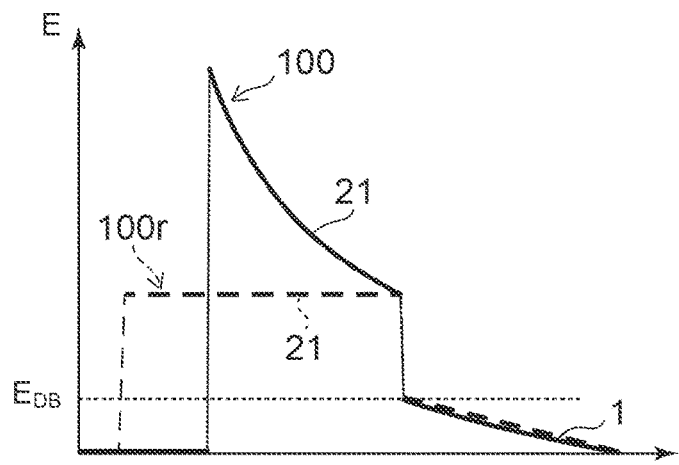
Figure 9C:
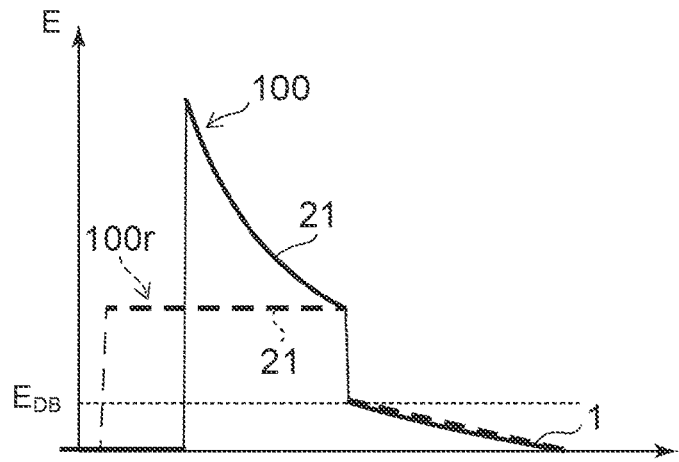

FIGS. 9A to 9C are graphs illustrating characteristics of the semiconductor device according to the first embodiment and the semiconductor device according to the reference example.

FIG. 10 is a table illustrating the design values of the semiconductor device according to the first embodiment and the semiconductor device according to the reference example.

FIGS. 9A to 10 illustrate simulation results when the ratios R of the semiconductor devices 100 and 100r are optimized for each product breakdown voltage. In FIGS. 9A to 9C, similarly to FIGS. 8A and 8B, the horizontal axis is the position in a lateral direction perpendicular to the first direction D1. The vertical axis is the electric field intensity. In FIG. 10, the half pitch refers to the value of one-half of the pitch. The pitch is the distance in the third direction D3 between the centers of the structure bodies 20. As illustrated in FIGS. 9A to 10, it can be seen that for each product breakdown voltage, i.e., 80 V, 100 V, and 150 V, the optimal ratio R of the dot-type is less than the ratio R of the stripe-type and is not more than 0.0055.

When the thickness $T_{ox}$ is reduced to reduce the ratio R, the distance between the structure bodies 20 also can be reduced. In other words, the pitch of the structure bodies 20 can be reduced. By reducing the pitch of the structure bodies 20, the channel surface area per unit area can be increased. In other words, the channel density can be increased. By increasing the channel density, the on-resistance of the semiconductor device 100 can be further reduced.

As described above, according to the first embodiment, the on-resistance of the semiconductor device 100 can be reduced by increasing the volume of the n⁻-type drift region 1 compared to the semiconductor device 100r. The actual breakdown voltage can be increased while maintaining the n-type impurity concentration in the n⁻-type drift region 1 by setting the ratio R (μm/V) to be not less than 0.003 and not more than 0.0055. Also, the on-resistance of the semiconductor device 100 can be further reduced because the pitch of the structure bodies 20 can be reduced.

It is desirable for the ratio R to be within the range described above at a cross section along the second and third directions D2 and D3 at the lower end vicinity of the conductive part 22. The electric field intensity in the first direction D1 is low in the n⁻-type drift region 1 that faces the lower end of the conductive part 22 in the second and third directions D2 and D3. In other words, it is difficult to deplete the n⁻-type drift region 1 facing the lower end of the conductive part 22 compared to the n⁻-type drift region 1 at the vicinity of the p-n junction surface between the n⁻-type drift region 1 and the p-type base region 2. By setting the ratio R (μm/V) to be not more than 0.0055 at the cross section passing through the lower end vicinity of the conductive part 22, the n⁻-type drift region 1 between the conductive parts 22 can be more reliably depleted, and the actual breakdown voltage can be further increased. Also, electric field concentration occurs at the insulating part 21 lower end vicinity. By setting the ratio R (μm/V) to be not less than 0.003, dielectric breakdown due to the electric field concentration at the insulating part 21 lower end can be suppressed, and the actual breakdown voltage can be increased.

For example, the length in the first direction D1 of the conductive part 22 is divided into ten equal portions. It is desirable for the ratio R (μm/V) at a cross section positioned one of the ten equal portions above the lower end of the conductive part 22 to be not less than 0.003 and not more than 0.0055.

In the semiconductor device 100, the structure body 20 is hexagonal when viewed along the first direction D1. The outer edge of the gate electrode 10 also is hexagonal according to the shape of the structure body 20. The multiple structure bodies 20 are arranged in a honeycomb configuration to be most dense in a plane along the second and third directions D2 and D3. By arranging the multiple structure bodies 20 to be most dense, the channel density can be increased, and the on-resistance of the semiconductor device 100 can be further reduced. Also, the width of the n⁻-type drift region 1 positioned between the structure bodies 20 can be more uniform. The actual breakdown voltage of the semiconductor device 100 can be further increased thereby.

Hereinabove, the structure of the semiconductor device 100 is described from the perspective of the ratio R (μm/V) of the thickness $T_{ox}$ (μm) to the product breakdown voltage V1 (V). The inventors discovered by another investigation that the desirable structure of the semiconductor device 100 can be described using formulas as follows.

The charge of a space V having the first center C1 as the center is taken as Q. The relationship between the charge Q, an electric flux density D ($=\varepsilon \times E$), and a charge density (a carrier density) ρ is represented by the following Formula 1 from Gauss's law.

$$\oint_s D \cdot dS = \int_v \rho dV = Q \quad \text{[Formula 1]}$$

Using Formula 1, an electric field intensity $E_{ox}$ in the insulating part 21 is represented by Formula 2. An electric field intensity $E_{si}$ in the n⁻-type drift region 1 is represented by Formula 3. In Formulas 2 and 3, $R_{si}$ corresponds to the distance from the first center C1 to the circle center C0. $R_{ox}$ corresponds to the distance from the circle center C0 to the interface between the n⁻-type drift region 1 and the insulating part 21.

$$E_{ox} = \frac{\rho(R_{si}^2 - R_{ox}^2)}{2\varepsilon_{ox}} \times \frac{1}{r} \quad \text{[Formula 2]}$$

$$E_{si} = \frac{\rho}{2\varepsilon_{si}} \times \left(\frac{R_{si}^2}{r} - r\right) \quad \text{[Formula 3]}$$

To reduce the on-resistance of the semiconductor device while realizing the product breakdown voltage V1, it is necessary to satisfy the following three conditions. The first condition is that the entire n⁻-type drift region 1 between the structure bodies 20 is depleted at the product breakdown voltage V1. The second condition is that the maximum electric field intensity in the n⁻-type drift region 1 is not more than the critical electric field intensity $E_{DB}$. When the n⁻-type drift region 1 includes silicon as the semiconductor material, the critical electric field intensity $E_{DB}$ is about 0.3 MV/cm. The third condition is that the thickness $T_{si}$ is adjusted so that the charge density ρ in the n⁻-type drift region 1 is a maximum.

The first condition and the second condition are respectively represented by Formulas 4 and Formula 5. In Formula 4, $R_P$ corresponds to the distance from the circle center C0 to the interface between the conductive part 22 and the insulating part 21.

$$V1 = \int_{R_P}^{R_{ox}} E_{ox} dr + \int_{R_{ox}}^{R_{si}} E_{si} dr \quad \text{[Formula 4]}$$

$$E_{si} < E_{DB} \quad \text{[Formula 5]}$$

The distance $R_{si}$ is determined according to the pitch of the structure bodies 20. When arbitrary fixed values are set for the distances $R_{si}$ and $R_P$, the only variables in Formulas 2 to 5 are the charge density ρ and a distance $R_{ox}$. By using Formulas 2 to 5, the distance $R_{ox}$ is determined so that the charge density μ is a maximum. The value of the distance $R_{ox}$ subtracted from the distance $R_{si}$ corresponds to the thickness $T_{si}$. The value of $R_P$ subtracted from $R_{si}$ corresponds to the thickness $T_{ox}$. The desirable range of the ratio R (μm/V), i.e., not less than 0.003 and not more than 0.0055, is derived as the result of the calculations using the product breakdown voltage V1 (V) and the thickness $T_{ox}$ (μm).

As an example, a pitch P in the second direction D2 or the third direction D3 of the structure body 20 is 2.6 μm. The distance $R_P$ is 0.4 μm. In such a case, the distance $R_{si}$ is determined to be about 1.5 μm by the following Formula 6 based on the first condition.

$$T_{si} = \frac{P}{\sqrt{3}} = 1.5 \quad \text{[Formula 6]}$$

Calculating the distance $R_{ox}$ and the charge density μ so that the charge density μ is a maximum and V1=100 V and $E_{si} < E_{DB}$ (=0.3 MV/cm) are satisfied gives the distance $R_{ox}$=0.9 μm and ρ=2.6×10$^{16}$ cm$^{-3}$. In other words, the thickness $T_{si}$ is obtained by subtracting the distance $R_{ox}$ from the distance $R_{si}$ and is 0.6 μm. The thickness $T_{ox}$ is obtained by subtracting the distance $R_P$ from the distance $R_{ox}$ and is 0.5 μm. The ratio R (μm/V) of the thickness $T_{ox}$ (μm) to the product breakdown voltage V1 (V) is 0.005.

As described above, by setting the distance $R_{si}$, the distance $R_{ox}$, a distance $R_P$, the electric field intensity $E_{ox}$, and the electric field intensity $E_{si}$ to satisfy Formulas 4 and 5, the semiconductor device 100 is obtained in which the product breakdown voltage V1 can be realized while maintaining the n-type impurity concentration in the n⁻-type drift region 1.

Modifications

Figure 11:
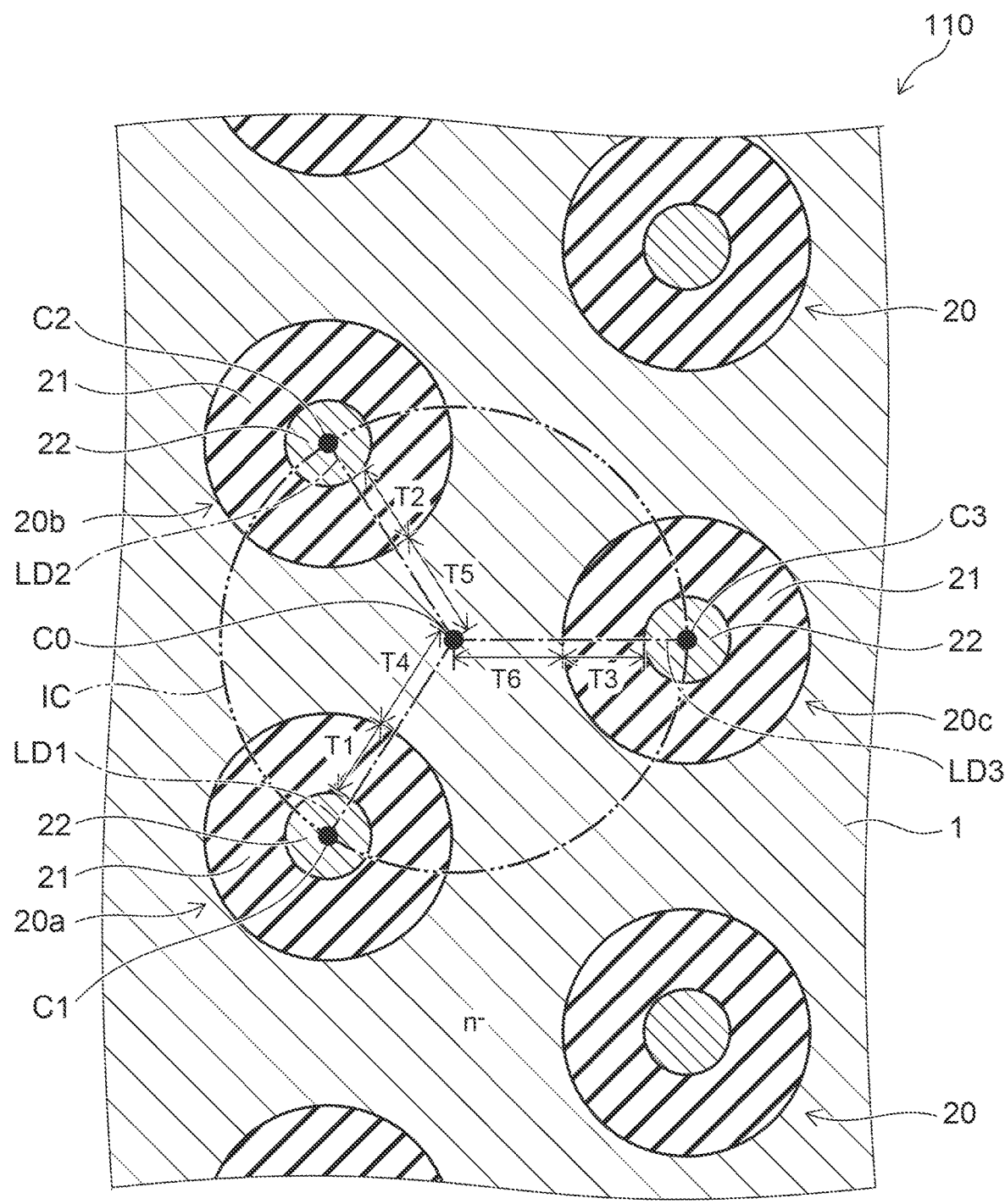
FIG. 11 is a plan view illustrating a semiconductor device according to modifications of the first embodiment.
Figure 11:
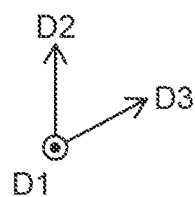
Figure 12:
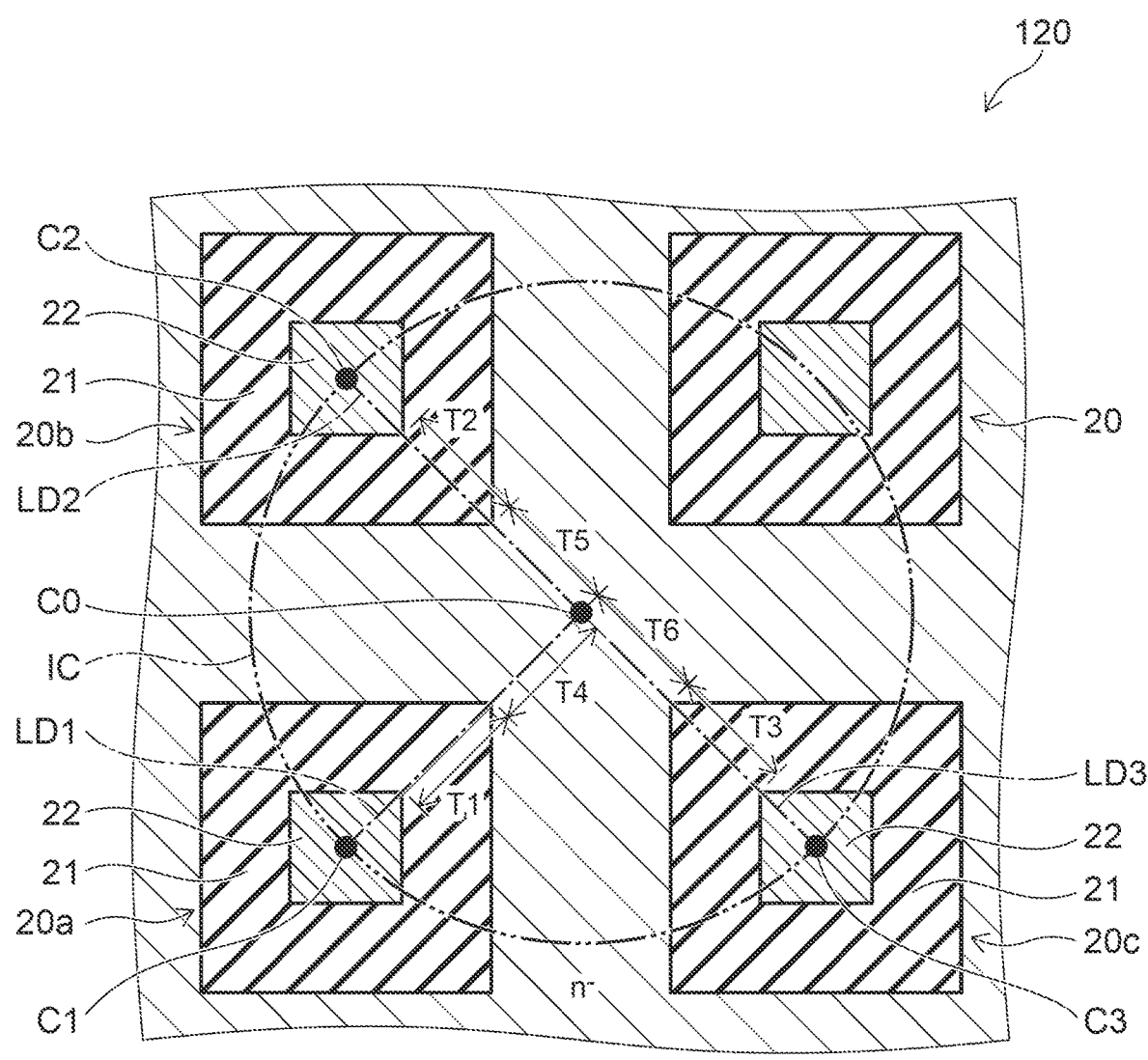
FIG. 12 is a plan view illustrating a semiconductor device according to modifications of the first embodiment.
Figure 12:
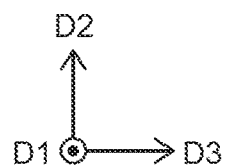

FIGS. 11 and 12 are plan views illustrating semiconductor devices according to modifications of the first embodiment.

Similarly to FIG. 5, FIGS. 11 and 12 illustrate the structures of cross sections along the second and third directions D2 and D3 at the lower end vicinity of the conductive part 22.

In a semiconductor device 110 illustrated in FIG. 11, the structure body 20 is circular when viewed along the first direction D1. In a semiconductor device 120 illustrated in FIG. 12, the structure body 20 is rectangular when viewed along the first direction D1. In the semiconductor device 110, the arrangement directions of the multiple structure bodies 20, i.e., the second direction D2 and the third direction D3, are not orthogonal to each other. Conversely, in the semiconductor device 120, the multiple structure bodies 20 are arranged along the second and third directions D2 and D3 that are orthogonal to each other. Thus, the shapes and arrangements of the multiple structure bodies 20 are modifiable as appropriate. In any configuration, the ratio (μm/V) of the thickness T1, T2, or T3 (μm) of the insulating part 21 to the product breakdown voltage (V) of the semiconductor device is not more than 0.0055. Thereby, the actual breakdown voltage of each semiconductor device can be increased while maintaining the n-type impurity concentration in the n⁻-type drift region 1. Also, because the thickness of the insulating part 21 is reduced to reduce the ratio, the pitch of the structure bodies 20 can be reduced, and the on-resistance of each semiconductor device can be further reduced.

Second Embodiment

Figure 13:
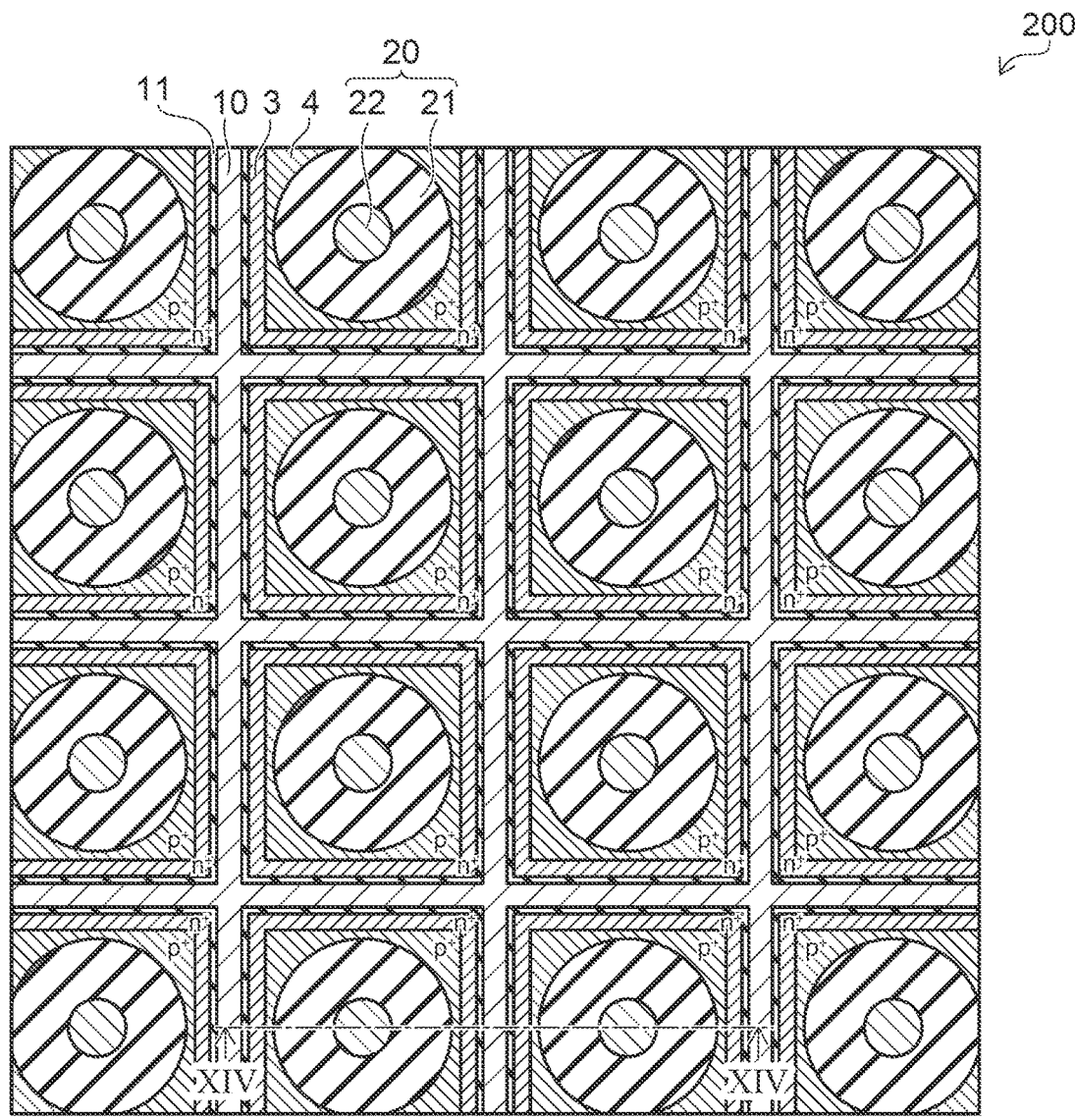
FIG. 13 is a plan view illustrating a semiconductor device according to a second embodiment.
Figure 13:
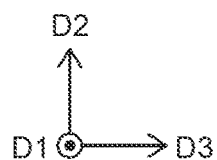

FIG. 13 is a plan view illustrating a semiconductor device according to a second embodiment.

Figure 14:
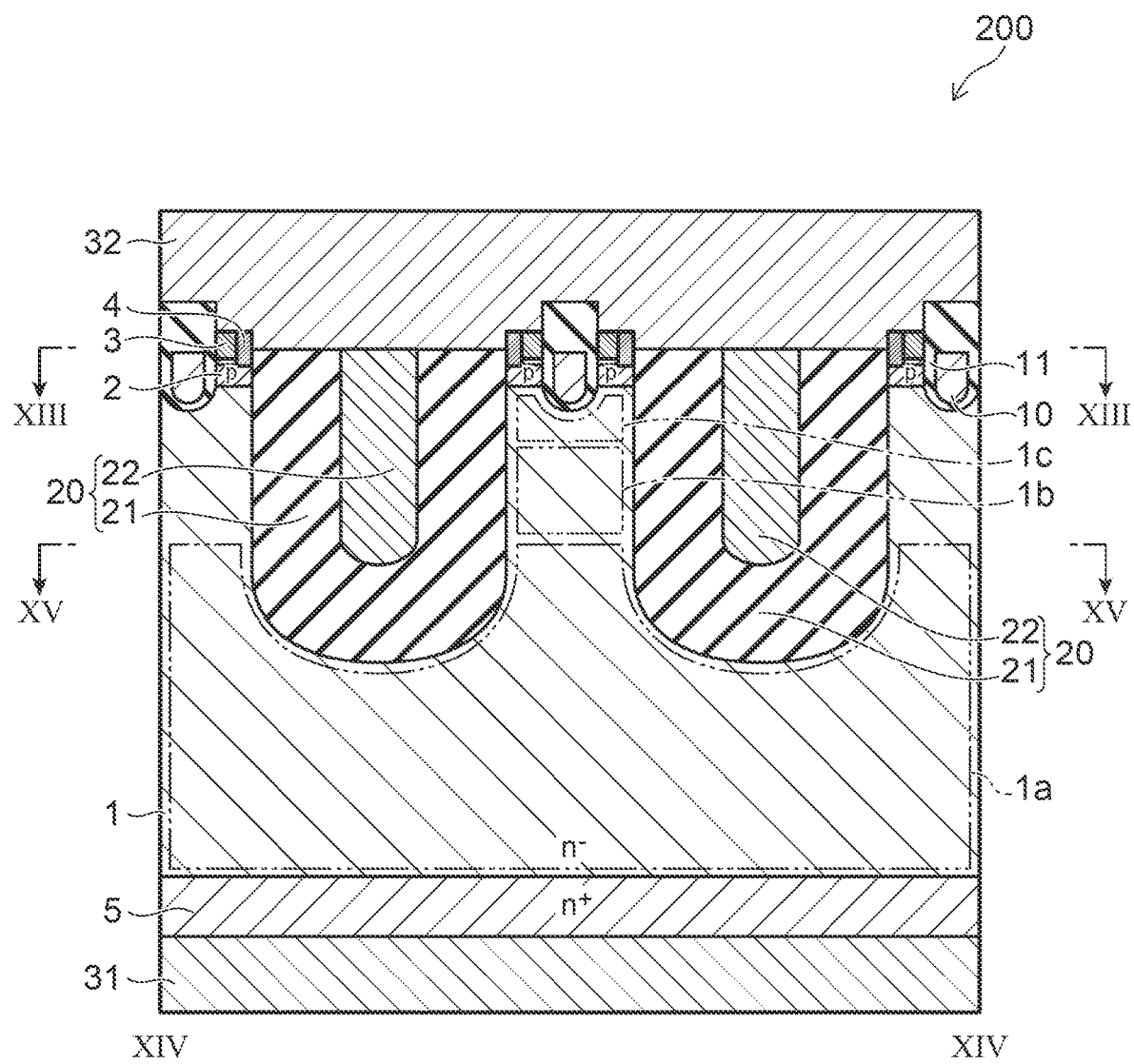
FIG. 14 is a XIV-XIV cross-sectional view of FIG. 13.
Figure 15:
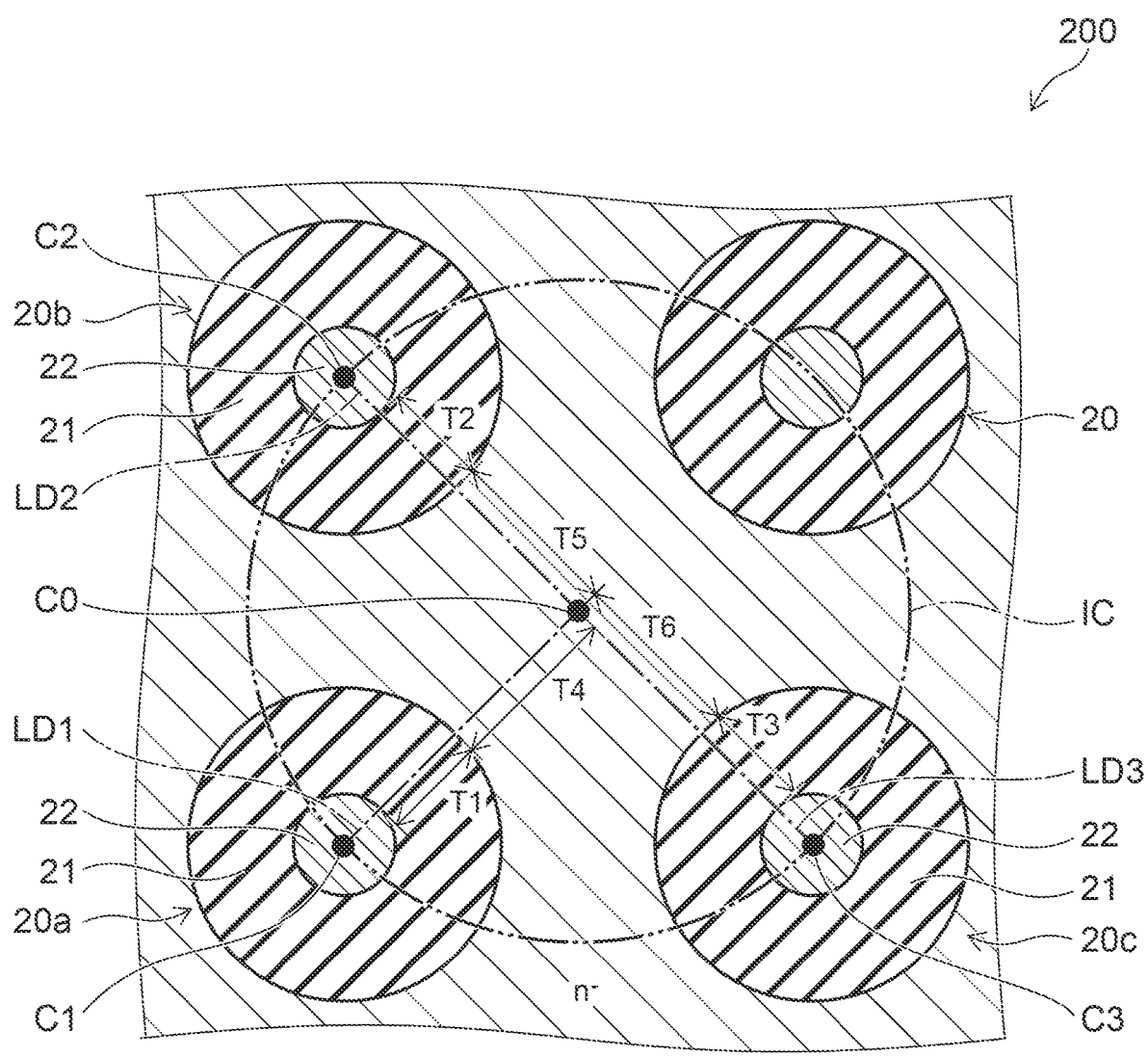
FIG. 15 is a XV-XV cross-sectional view of FIG. 14.
Figure 15:
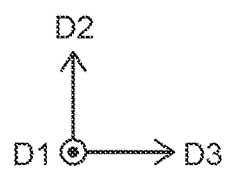

FIG. 14 is a XIV-XIV cross-sectional view of FIG. 13. FIG. 15 is a XV-XV cross-sectional view of FIG. 14.

FIG. 13 corresponds to a XIII-XIII cross-sectional view of FIG. 14. In the semiconductor device 200 according to the second embodiment, the gate electrode 10 is separated from the structure body 20 as illustrated in FIGS. 13 to 15.

As illustrated in FIG. 13, the gate electrode 10 is located around the structure bodies 20. A portion of the gate electrode 10 extends in the third direction D3 between the structure bodies 20 next to each other in the second direction D2. Another portion of the gate electrode 10 extends in the second direction D2 between the structure bodies 20 next to each other in the third direction D3.

As illustrated in FIGS. 13 and 14, the multiple p-type base regions 2 are located respectively between the gate electrode 10 and the multiple structure bodies 20 in the second and third directions D2 and D3. The n⁺-type source region 3 and the p⁺-type contact region 4 are selectively provided on each p-type base region 2. The gate electrode 10 faces the p-type base region 2 via the gate insulating layer 11 in the second and third directions D2 and D3.

The source electrode 32 is located on the multiple p-type base regions 2, the multiple n⁺-type source regions 3, the multiple p⁺-type contact regions 4, the gate electrode 10, and the multiple structure bodies 20 and is electrically connected to the multiple p-type base regions 2, the multiple n⁺-type source regions 3, the multiple p⁺-type contact regions 4, and the multiple conductive parts 22.

According to the second embodiment as well, the ratio (μm/V) to the product breakdown voltage (V) of the semiconductor device 200 of the thickness (μm) of at least one insulating part 21 in a direction perpendicular to the first direction D1 is not less than 0.003 and not more than 0.0055. It is favorable for the ratio (μm/V) to the product breakdown voltage (V) of the semiconductor device 200 of the thickness (μm) of each insulating part 21 in the perpendicular direction to be not less than 0.003 and not more than 0.0055.

More specifically, as illustrated in FIG. 15, it is favorable for the ratio (μm/V) to the product breakdown voltage V1 (V) of the semiconductor device 200 of the thickness T1 (μm) of the insulating part 21 between the circle center C0 and the first center C1 to be not less than 0.003 and not more than 0.0055. It is favorable for the ratio (μm/V) to the product breakdown voltage V1 (V) of the thickness T2 (μm) of the insulating part 21 between the circle center C0 and the second center C2 to be not less than 0.003 and not more than 0.0055. It is favorable for the ratio (μm/V) to the product breakdown voltage V1 (V) of the thickness T3 (μm) of the insulating part 21 between the circle center C0 and the third center C3 to be not less than 0.003 and not more than 0.0055. Thereby, the actual breakdown voltage of each semiconductor device can be increased while maintaining the n-type impurity concentration in the n⁻-type drift region 1.

Thus, the arrangement of the gate electrode 10 and the multiple structure bodies 20 is modifiable as appropriate. According to the first and second embodiments as well, the actual breakdown voltage of each semiconductor device can be increased by setting the ratio (μm/V) described above to be not less than 0.003 and not more than 0.0055. Also, because the thickness of the insulating part 21 is reduced to reduce the ratio, the pitch of the structure bodies 20 can be reduced, and the on-resistance of each semiconductor device can be further reduced.

Examples are shown in FIGS. 13 to 15 in which the second direction D2 and the third direction D3 that are the arrangement directions of the multiple structure bodies 20 are orthogonal to each other. The semiconductor device according to the second embodiment is not limited to the example. Similarly to the examples illustrated in FIGS. 5 and 11, in the semiconductor device according to the second embodiment, the multiple structure bodies 20 may be arranged along the second and third directions D2 and D3 that are not orthogonal to each other. Also, similarly to the examples illustrated in FIGS. 11 and 12, the shapes of the structure bodies 20 when viewed along the first direction D1 are modifiable as appropriate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
    a first electrode;
    a first semiconductor region provided on the first electrode, the first semiconductor region being of a first conductivity type;
    a second semiconductor region provided on the first semiconductor region, the second semiconductor region being of a second conductivity type;
    a third semiconductor region provided selectively on the second semiconductor region, the third semiconductor region being of the first conductivity type;
    a structure body including
        an insulating part arranged with the third semiconductor region, the second semiconductor region, and a portion of the first semiconductor region in a second direction and a third direction, the second direction being perpendicular to a first direction from the first electrode toward the first semiconductor region, the third direction crossing the second direction and being perpendicular to the first direction, and
        a conductive part provided in the insulating part, the conductive part including a portion facing the first semiconductor region in the second and third directions;
    a gate electrode facing the second semiconductor region in the second and third directions; and
    a second electrode provided on the second semiconductor region, the third semiconductor region, and the structure body,
    the second electrode being electrically connected to the second semiconductor region, the third semiconductor region, and the conductive part,
    a plurality of structure bodies being arranged along the second and third directions, a ratio (μm/V) to a product breakdown voltage (V) of a thickness (μm) of the insulating part in a direction perpendicular to the first direction being not more than 0.0055.

2. The device according to claim 1, wherein the third direction is oblique to a direction perpendicular to the first and second directions.

3. The device according to claim 1, wherein a plurality of the gate electrodes is provided respectively in a plurality of the insulating parts.

4. The device according to claim 1, wherein the gate electrode is between structure bodies of the plurality of structure bodies next to each other in the second direction, and between structure bodies of the plurality of structure bodies next to each other in the third direction.

5. A semiconductor device, comprising:
a first electrode;
a first semiconductor region provided on the first electrode, the first semiconductor region being of a first conductivity type;
a second semiconductor region provided on the first semiconductor region, the second semiconductor region being of a second conductivity type;
a third semiconductor region provided selectively on the second semiconductor region, the third semiconductor region being of the first conductivity type;
a structure body including
an insulating part arranged with the third semiconductor region, the second semiconductor region, and a portion of the first semiconductor region in a second direction and a third direction, the second direction being perpendicular to a first direction from the first electrode toward the first semiconductor region, the third direction crossing the second direction and being perpendicular to the first direction, and
a conductive part provided in the insulating part, the conductive part including a portion facing the first semiconductor region in the second and third directions;
a gate electrode facing the second semiconductor region in the second and third directions; and
a second electrode provided on the second semiconductor region, the third semiconductor region, and the structure body,
the second electrode being electrically connected to the second semiconductor region, the third semiconductor region, and the conductive part,
a plurality of the structure bodies being arranged along the second and third directions,
the plurality of structure bodies including
a first structure body,
a second structure body next to the first structure body in the second direction, and
a third structure body next to the first structure body in the third direction,
a ratio (μm/V) to a product breakdown voltage (V) of a thickness (μm) of the insulating part of the first structure body in a first line direction between a first center and a circle center of an imaginary circle being not less than 0.003 and not more than 0.0055,
the imaginary circle passing through centers in the second and third directions of the first, second, and third structure bodies,
the first center being of the first structure body in the second and third directions, the first line direction connecting the circle center and the first center.

6. The device according to claim 5, wherein
a ratio (μm/V) to the product breakdown voltage (V) of a thickness (μm) of the insulating part of the second structure body in a second line direction between the circle center and a second center is not less than 0.003 and not more than 0.0055,
the second center is of the second structure body in the second and third directions,
the second line direction connects the circle center and the second center,
a ratio (μm/V) to the product breakdown voltage (V) of a thickness (Ξm) of the insulating part of the third structure body in a third line direction between the circle center and a third center is not less than 0.003 and not more than 0.0055,
the third center is of the third structure body in the second and third directions, and
the third line direction connects the circle center and the third center.

7. A semiconductor device, comprising:
a first electrode;
a first semiconductor region provided on the first electrode, the first semiconductor region being of a first conductivity type;
a second semiconductor region provided on the first semiconductor region, the second semiconductor region being of a second conductivity type;
a third semiconductor region provided selectively on the second semiconductor region, the third semiconductor region being of the first conductivity type;
a structure body including
an insulating part arranged with the third semiconductor region, the second semiconductor region, and a portion of the first semiconductor region in a second direction and a third direction, the second direction being perpendicular to a first direction from the first electrode toward the first semiconductor region, the third direction crossing the second direction and being perpendicular to the first direction, and
a conductive part provided in the insulating part, the conductive part including a portion facing the first semiconductor region in the second and third directions;
a gate electrode facing the second semiconductor region in the second and third directions; and
a second electrode provided on the second semiconductor region, the third semiconductor region, and the structure body, the second electrode being electrically connected to the second semiconductor region, the third semiconductor region, and the conductive part,
a plurality of the structure bodies being arranged along the second and third directions,
the plurality of structure bodies including
a first structure body,
a second structure body next to the first structure body in the second direction, and
a third structure body next to the first structure body in the third direction,
the following formulas being satisfied, in which a distance between a first center and a circle center of an imaginary circle is $R_{si}$, the imaginary circle passes through centers in the second and third directions of the first, second, and third structure bodies, the first center is of the first structure body in the second and third directions, a distance from the first center to an interface between the first structure body and the first semiconductor region is $R_{ox}$, a distance from the first center to an interface between the insulating part and the conductive part of the first structure body is $R_P$, an electric field intensity in the insulating part of the first structure body is $E_{ox}$, an electric field intensity in the first semiconductor region is $E_{si}$, a critical electric field intensity is $E_{DB}$, and a product breakdown voltage is V1.

$$V1 = \int_{R_p}^{R_{ox}} E_{ox}dr + \int_{R_{ox}}^{R_{si}} E_{si}dr$$

$$E_{si} < E_{DB}$$

* * * * *